United States Patent
Chan et al.

(10) Patent No.: US 7,250,669 B2
(45) Date of Patent: Jul. 31, 2007

(54) PROCESS TO REDUCE SUBSTRATE EFFECTS BY FORMING CHANNELS UNDER INDUCTOR DEVICES AND AROUND ANALOG BLOCKS

(75) Inventors: Lap Chan, Singapore (SG); Sanford Chu, Singapore (SG); Chit Hwei Ng, Singapore (SG); Purakh Verma, Singapore (SG); Jia Zhen Zheng, Singapore (SG); Johnny Chew, Singapore (SG); Choon Beng Sia, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/909,523

(22) Filed: Aug. 2, 2004

(65) Prior Publication Data
US 2005/0009357 A1    Jan. 13, 2005

Related U.S. Application Data

(63) Continuation of application No. 10/225,828, filed on Aug. 22, 2002, now Pat. No. 6,869,884.

(51) Int. Cl.
*H01L 29/00* (2006.01)
(52) U.S. Cl. .............. 257/531; 257/528; 257/724; 257/E21.022; 438/700
(58) Field of Classification Search ............ None
See application file for complete search history.

(56) References Cited

U.S. PATENT DOCUMENTS

| | | | |
|---|---|---|---|
| 5,539,241 A | 7/1996 | Abidi et al. | 257/531 |
| 5,600,174 A | 2/1997 | Reay et al. | 257/467 |
| 5,976,945 A * | 11/1999 | Chi et al. | 438/386 |
| 6,057,202 A | 5/2000 | Chen et al. | 438/381 |
| 6,180,995 B1 * | 1/2001 | Hebert | 257/531 |
| 6,287,931 B1 | 9/2001 | Chen | 438/381 |
| 6,313,008 B1 | 11/2001 | Leung et al. | 438/424 |
| 6,326,314 B1 * | 12/2001 | Merrill et al. | 438/750 |

* cited by examiner

*Primary Examiner*—Leonardo Andujar
*Assistant Examiner*—Scott R Wilson
(74) *Attorney, Agent, or Firm*—Saile Ackerman LLC; Stephen B. Ackerman; Stephen G. Stanton

(57) ABSTRACT

A first method of reducing semiconductor device substrate effects comprising the following steps. $O^+$ or $O_2^+$ are selectively implanted into a silicon substrate to form a silicon-damaged silicon oxide region. One or more devices are formed over the silicon substrate proximate the silicon-damaged silicon oxide region within at least one upper dielectric layer. A passivation layer is formed over the at least one upper dielectric layer. The passivation layer and the at least one upper dielectric layer are patterned to form a trench exposing a portion of the silicon substrate over the silicon-damaged silicon oxide region. The silicon-damaged silicon oxide region is selectively etched to form a channel continuous and contiguous with the trench whereby the channel reduces the substrate effects of the one or more semiconductor devices. A second method of reducing substrate effects under analog devices includes forming an analog device on a SOI substrate and then selectively etching the silicon oxide layer of the SOI substrate to form a channel at least partially underlying the analog device.

34 Claims, 3 Drawing Sheets

PROCESS TO REDUCE SUBSTRATE EFFECTS BY FORMING CHANNELS UNDER INDUCTOR DEVICES AND AROUND ANALOG BLOCKS

This is a continuation of patent application Ser. No. 10/225,828, filing date Aug. 22, 2002, now U.S. Pat. No. 6,869,884, A Process To Reduce Substrate Effects By Forming Channels Under Inductor Devices And Around Analog Blocks, assigned to the same assignee as the present invention, which is herein incorporated by reference in its entirety.

FIELD OF THE INVENTION

The present invention relates generally to fabrication of semiconductor devices, and more specifically to methods of reducing substrate effects under inductor devices and around analog blocks.

BACKGROUND OF THE INVENTION

Inductor quality (Q) is very often reduced by substrate eddy current, i.e. image current. Similarly, analog devices are very sensitive to noise generated by the underlying silicon substrate, i.e. substrate effects.

U.S. Pat. No. 6,180,995 B1 to Hebert describes a process to etch a trench in a substrate under an inductor.

U.S. Pat. No. 6,313,008 B1 to Leung et al. describes a trench formed by an implant and isotropic etch process.

U.S. Pat. No. 6,326,314 B1 to Merrill et al. describes an inductor process with a trench in a substrate.

U.S. Pat. No. 6,287,931 B1 to Chen describes an inductor process with a trench in an insulating layer.

U.S. Pat. No. 6,057,202 to Chen et al. describes a trench under inductors.

U.S. Pat. No. 5,539,241 to Abidi et al. and U.S. Pat. No. 5,600,174 to Reay et al. each describe inductor processes with trenches underlying the structure.

SUMMARY OF THE INVENTION

Accordingly, it is an object of the present invention to provide improved methods of reducing substrate effects under inductor devices and around analog blocks.

Other objects will appear hereinafter.

It has now been discovered that the above and other objects of the present invention may be accomplished in the following manner. Specifically, in a first method of reducing semiconductor device substrate effects, $O^+$ or $O_2^+$ are selectively implanted into a silicon substrate to form a silicon-damaged silicon oxide region. One or more devices are formed over the silicon substrate proximate the silicon-damaged silicon oxide region within at least one dielectric layer. A passivation layer is formed over the at least one upper dielectric layer. The passivation layer and the at least one upper dielectric layer are patterned to form a trench exposing a portion of the silicon substrate over the silicon-damaged silicon oxide region. The silicon-damaged silicon oxide region is selectively etched to form a channel continuous and contiguous with the trench whereby the channel reduces the substrate effects of the one or more semiconductor devices. A second method of reducing substrate effects under analog devices includes forming an analog device on a SOI substrate and then selectively etching the silicon oxide layer of the SOI substrate to form a channel at least partially underlying the analog device.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

First Preferred Embodiment- FIGS. 1 to 5

Initial Structure

Figure 1:
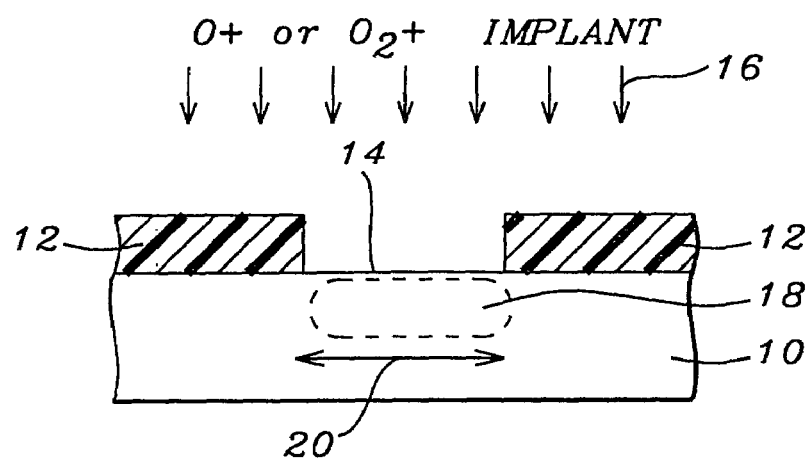
FIGS. 1 to 5 schematically illustrate in cross-sectional representation a first preferred embodiment of the present invention.

FIG. 1 illustrates a cross-sectional view of a silicon substrate 10 that is preferably a semiconductor substrate.

A first patterned masking layer 12 is formed over silicon substrate 10 leaving a portion 14 of silicon substrate 10 exposed. First masking layer 12 is preferably comprised of photoresist.

Using the first patterned masking layer 12 as a mask, an oxygen implant 16 is implanted into silicon substrate 10 to a depth of preferably from about 1000 to 20,000 Å and more preferably from about 5000 to 10,000 Å to form a silicon-damaged silicon oxide ($SiO_2$) portion 18 within silicon substrate 10. The oxygen implant 16 is either an $O^+$ or an $O_2^+$ implant and is conducted at a dose of preferably from about 1E16 to 1E17 ions/cm$^2$ and more preferably from about 4E16 to 8E16 ions/cm$^2$.

Silicon-damaged portion 18 has a maximum width 20 of preferably from about 8 to 52 μm and more preferably about 10 to 50 μm.

Formation of ILD Layer 24

Figure 2:
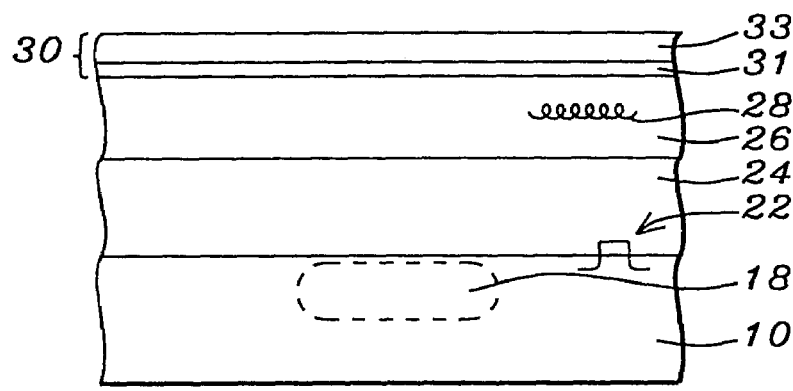

As shown in FIG. 2, first patterned masking layer 12 is removed, the structure is cleaned as necessary and a metal-oxide semiconductor (MOS) device 22 may be formed upon silicon substrate 10 adjacent silicon-damaged silicon oxide portion 18.

An interlayer dielectric (ILD) layer 24 is formed over silicon substrate 10 and over any semiconductor devices 22 formed upon silicon substrate 10 to a thickness of preferably from about 4000 to 12,000 Å and more preferably from about 6000 to 10,000 Å. ILD layer 24 is preferably formed of thick field oxide, boron phosphorus silicon glass (BPSG), PECVD TEOS oxide, APCVD $O_3$/TEOS oxide or HDP oxide and is more preferably BPSG doped oxide.

ILD layer 24 may also include interconnect structures and other semiconductor devices (not shown).

Formation of Inductor 28 Within Dielectric Layer 26

As shown in FIG. 2, a second IMD dielectric layer 26 is formed over the ILD layer 24 and an inductor 28 may be formed with the second/upper dielectric layer 26 adjacent the silicon-damaged silicon oxide portion 18 in conjunction with, or in place of, the semiconductor device 22.

IMD dielectric layer 26 is preferably comprised of an HDP oxide/TEOS oxide sandwich, PECVD $SiH_4$ oxide, PECVD TEOS oxide or HDP oxide (for gap fill) and is more preferably an HDP oxide/TEOS oxide sandwich. Dielectric layer 26 has a thickness of preferably from about 4000 to 12,000 Å and more preferably from about 6000 to 10,000 Å.

Formation of Passivation Layer 30

Passivation layer 30 is then formed over IMD dielectric layer 26. Passivation layer 30 preferably comprises a lower 2% PSG layer 31 having a thickness of preferably from about 2000 to 4000 Å and more preferably from about 2500 to 3500 Å and an upper, overlying nitride or silicon nitride layer 33 having a thickness of preferably from about 3000 to 8000 and more preferably from about 4000 to 6000 Å.

Etching of Trench 34

Figure 3:
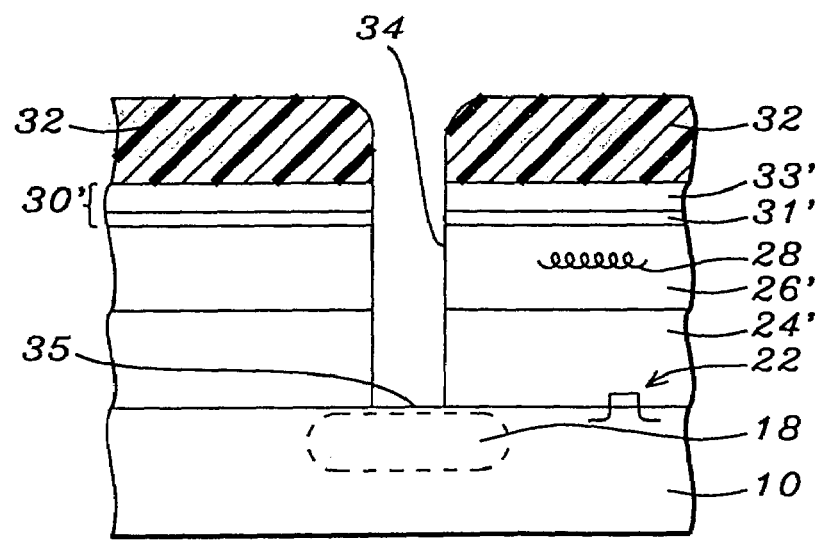

As shown in FIG. 3, a second patterned masking layer 32 is formed over passivation layer 30 and, using the second patterned masking layer as a mask, passivation layer 30, IMD dielectric layer 26 and ILD layer 24 are etched over silicon-damaged silicon oxide portion 18 forming trench 34 and exposing a portion 35 of silicon substrate 10 roughly centered over silicon-damaged silicon oxide portion 18.

Trench 34 is preferably formed using a reactive ion etch (RIE), an high density plasma (HDP) oxide etch or an inductive couple plasma (ICP) etch and more preferably an RIE oxide etch to save cost.

Formation of Channel 36

Figure 4:
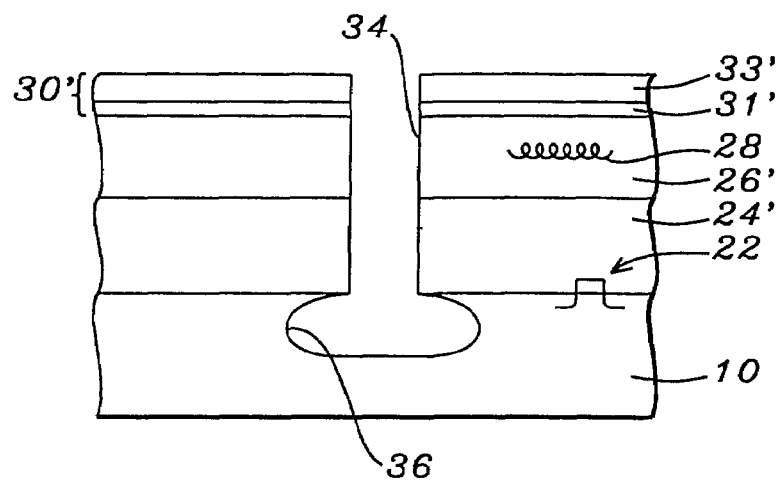

As shown in FIG. 4, an isotropic etch is used to etch out the silicon-damaged silicon oxide portion 18 to form trench/channel 36. Preferably from about 10 to 50 μm of silicon substrate 10 adjacent silicon-damage silicon oxide portion 18 is also removed to create a wider channel 36. Channel 36 has a maximum width 37 of from about 50 to 500 μm.

The formation of trench 34 and channel 36 reduces the substrate noise effect on the MOS device 22 and, if formed, also reduces the substrate effect on the inductor 28 quality factor (Q). With the formation of inductor 28/dielectric layer 26, a system-on-chip on non-silicon-on-insulator (SOI) substrate is formed.

Formation of Uppermost Sealing Layer 38

Figure 5:
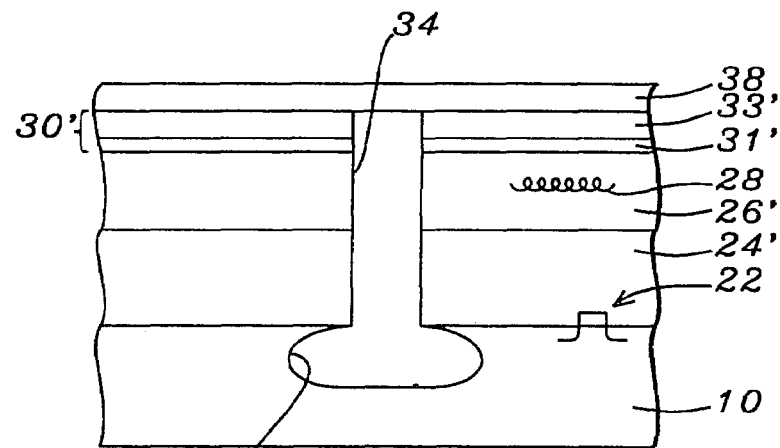

As shown in FIG. 5, an optional uppermost sealing layer 38 may then be formed over patterned passivation layer 30', sealing or closing off trench 34. Uppermost sealing layer 38 is preferably formed to a thickness of from about 3000 to 7000 Å and more preferably from about 3000 to 6000 Å. Sealing layer 38 is preferably comprised of PECVD nitride or PECVD silicon nitride (to minimize wafer scratching). It is noted that optional uppermost sealing layer 38 may not be necessary.

Second Embodiment - FIGS. 6 to 9

Initial Structure

Figure 6:
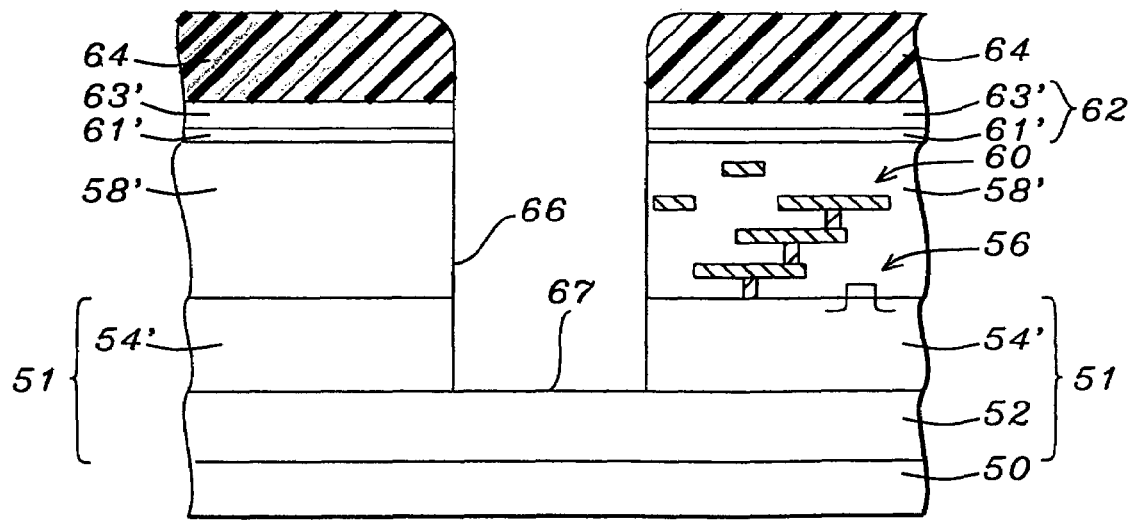
FIGS. 6 to 8 schematically illustrate in cross-sectional representation a second preferred embodiment of the present invention.

FIG. 6 illustrates a cross-sectional view of a silicon-on-insulator (SOI) substrate 51 over silicon substrate 50 that is preferably a semiconductor substrate. A silicon oxide ($SiO_2$) layer 52 is formed over silicon substrate 50 to a thickness of preferably from about 500 to 2000 Å and more preferably from about 500 to 1500 Å. A second silicon layer 54 is then formed over $SiO_2$ layer 52 to a thickness of preferably from about 500 to 2000 Å and more preferably from about 500 to 1500 Å.

A MOS device 56 may be formed upon SOI substrate 54 and an analog device represented as at 60 is formed within ILD layer 58. ILD layer 58 may be comprised of multiple layers and is preferably comprised of PECVD TEOS oxide, PECVD $SiH_4$ oxide, HDP oxide or a low-k dielectric material and is more preferably comprised of a low-k dielectric material.

A passivation layer 62 is formed over ILD layer 58. Passivation layer 62 preferably comprises a lower 2% PSG layer 61 having a thickness of preferably from about 2000 to 4000 Å and more preferably from about 2500 to 3500 Å and an upper, overlying nitride or silicon nitride layer 63 having a thickness of preferably from about 3000 to 8000 and more preferably from about 4000 to 6000 Å.

Formation of Trench 66

A first patterned masking layer 64 is formed over passivation layer 62 and is preferably comprised of photoresist having a thickness of preferably from about 8000 to 22,000 Å and more preferably from about 12,000 to 18,000.

As shown in FIG. 6, using first patterned masking layer 64 as a mask, passivation layer 62, ILD layer 58 and silicon layer/SOI substrate 54 are patterned to form trench 66 exposing a portion 67 of $SiO_2$ layer 52 adjacent analog device 60 and MOS 56.

Formation of Channel 70

Figure 7:
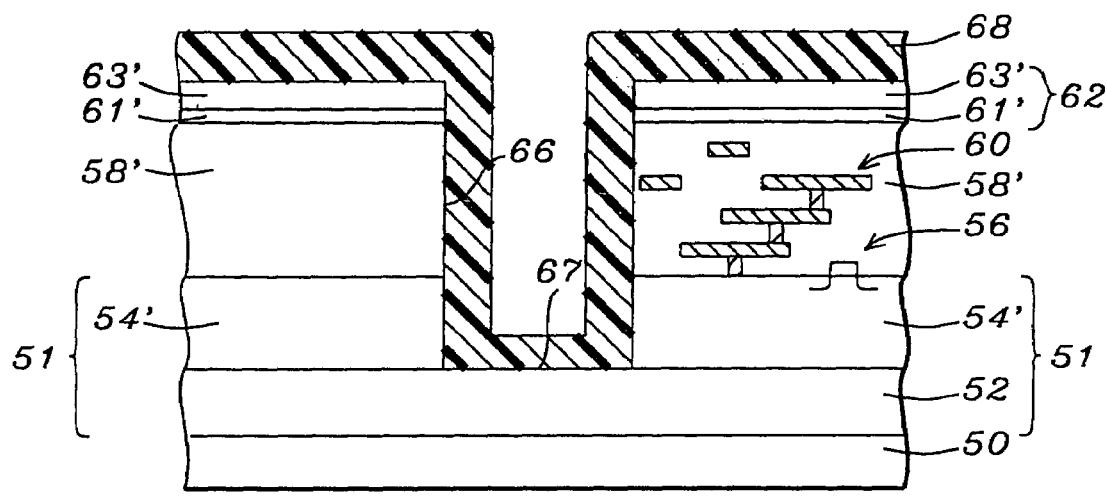

As shown in FIG. 7, first patterned masking/photoresist layer 64 is removed, preferably by a plasma $O_2$ resist strip (PRS) followed by a chemical resist strip (CRS) using a sulfuric peroxide mixture.

Then, as shown in FIG. 7, a second patterned masking layer 68 is deposited over patterned passivation layer 62', over the side walls of trench 66 and partially over the exposed portion 67 of $SiO_2$ layer 52. Second patterned masking layer 68 is preferably comprised of nitride or silicon nitride and has a thickness of preferably from about 1500 to 2000 Å and more preferably from about 1750 to 2250 Å.

Formation of Sidewall Spacers 71

Figure 8:
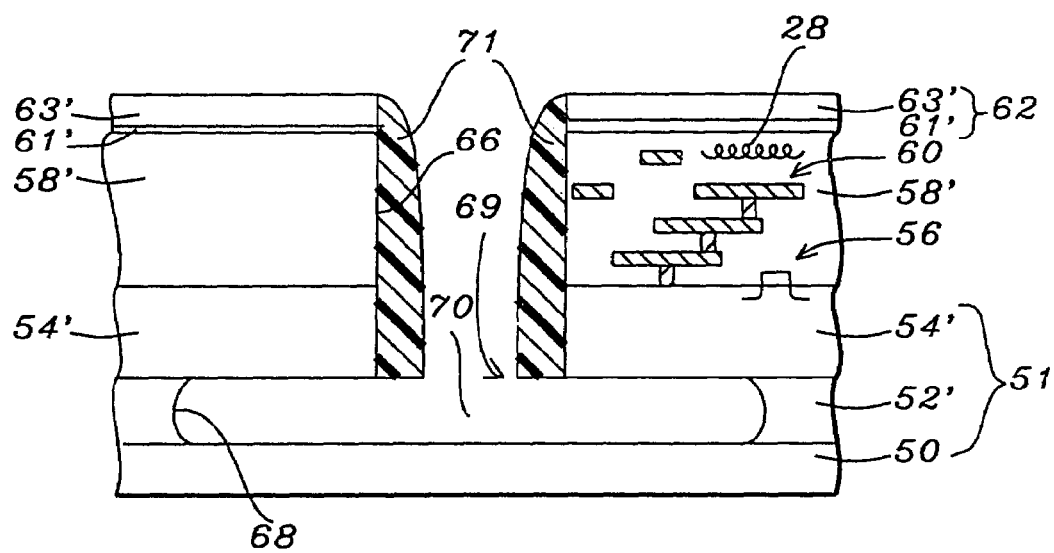

As shown in FIG. 8, second patterned masking nitride/silicon nitride layer 68 is etched to form sidewall spacers 71 over the side walls of trench 66, to protect the side walls of trench 66.

A wet etch process is then used to etch channel 70 within $SiO_2$ layer 52 through second patterned masking layer opening 69/sidewall spacers 71. The wet etch process preferably employs a 10:1 dilute HF solution.

Channel 70 extends under at least a portion of analog device 60 and under MOS device 56. Channel 70 has a width of preferably from about 50 to 250 μm and more preferably from about 100 to 200 μm.

The formation of channel 70 reduces the substrate noise effect on the analog device 60 and MOS device 56.

Figure 9:
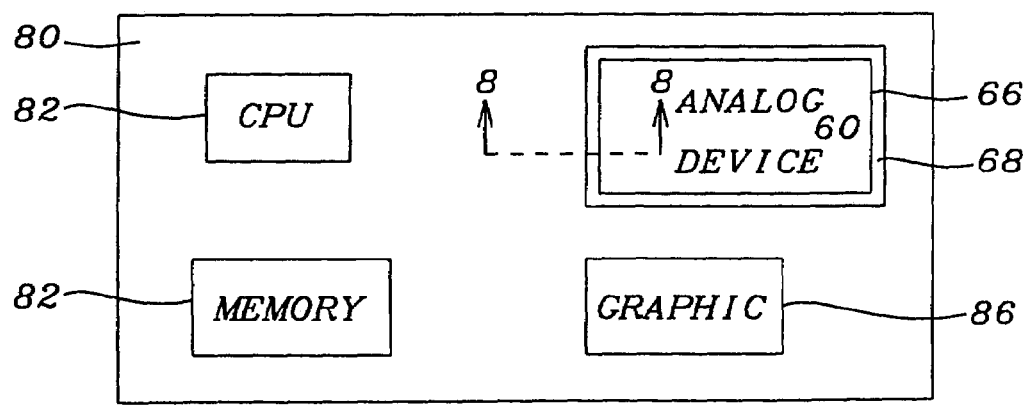
FIG. 9 schematically illustrates a plan view incorporating the structure of FIG. 8 along line 8-8.

FIG. 9 is an overhead plan view of a system-on-chip 80 incorporating analog device 60 with trench 66 and channel 70 formed around its periphery. FIG. 8 is a cross-sectional view of FIG. 9 alone line 8-8. System-on-chip 80 also includes a central processing unit (CPU) 82, memory 84 and graphic device 86.

Advantages of the Invention

The advantages of one or more embodiments of the present invention include:
1) reduction of substrate effects, i.e. noise reduction, for the inductor devices;
2) increased inductor quality (Q factor) by reduction of the substrate eddy current; and
3) to provide the environment for multi-functional chips on the same substrate, i.e., e.g., system-on-chip.

While particular embodiments of the present invention have been illustrated and described, it is not intended to limit the invention, except as defined by the following claims.

We claim:

1. A semiconductor structure, comprising:
   a semiconductor substrate having an unfilled channel formed therein;
   at least one semiconductor device formed adjacent the unfilled channel;
   one or more dielectric layers formed over the semiconductor substrate and the at least one semiconductor device;
   a passivation layer over the one or more dielectric layers; and
   a trench extending through: the passivation layer; and the one or more dielectric layers to the unfilled channel, the trench being continuous and contiguous with the unfilled channel wherein the unfilled channel reduces the substrate effects of the at least one semiconductor device.

2. The structure of claim 1, further comprising an uppermost sealing layer over the passivation layer.

3. The structure of claim 1, further comprising an uppermost sealing layer over the passivation layer; the uppermost sealing layer being comprised of PECVD nitride or PECVD silicon nitride.

4. The structure of claim 1, further comprising an uppermost sealing layer over the passivation layer, sealing the trench from the ambient atmosphere; the uppermost sealing layer being comprised of PECVD silicon nitride.

5. The structure of claim 1, wherein the one or more dielectric layers are comprised of boron phosphorus silicon glass (BPSG), PECVD TEOS oxide, APCVD O$_3$/TEOS oxide or HDP oxide.

6. The structure of claim 1, wherein the one or more dielectric layers are comprised of BPSG doped oxide.

7. The structure of claim 1, wherein the one or more dielectric layers comprise:
   a lower dielectric layer comprised of boron phosphorus silicon glass (BPSG), PECVD TEOS oxide, APCVD O$_3$/TEOS oxide or HDP oxide; and
   an upper dielectric layer comprised of an HDP oxide/TEOS oxide sandwich, PECVD SiH$_4$ oxide, PECVD TEOS oxide or HDP oxide.

8. The structure of claim 1, wherein the one or more dielectric layers comprise:
   a lower dielectric layer comprised of BPSG doped oxide; and
   an upper dielectric layer comprised of an HDP oxide/TEOS oxide sandwich.

9. The structure of claim 1, wherein the at least one semiconductor device is at least one MOS device.

10. The structure of claim 1, wherein the at least one semiconductor device is at least one inductor.

11. The structure of claim 1, wherein the at least one semiconductor device is one or more MOS devices and one or more inductors.

12. The structure of claim 1, wherein the passivation layer is comprised of a lower layer and an upper layer.

13. The structure of claim 1, wherein the passivation layer is comprised of a lower PSG layer and an upper nitride or silicon nitride layer.

14. The structure of claim 1, wherein the passivation layer is comprised of:
   a lower PSG layer having a thickness of from about 2000 to 4000 Å; and
   an upper nitride or silicon nitride layer having a thickness of from about 3000 to 8000 Å.

15. The structure of claim 1, wherein the passivation layer is comprised of:
   a lower PSG layer having a thickness of from about 2500 to 3500 Å; and
   an upper nitride or silicon nitride layer having a thickness of from about 4000 to 6000 Å.

16. The structure of claim 1, wherein the channel has a maximum width of from about 50 to 500 µm.

17. The structure of claim 1, wherein the at least one semiconductor device forms part of a analog device on a chip, the unfilled channel being located around a periphery of the analog device.

18. A semiconductor structure, comprising:
   a substrate;
   a silicon oxide layer over the substrate; the silicon oxide layer having an unfilled channel formed therein;
   a silicon layer upon the silicon oxide layer;
   one or more dielectric layers formed over the silicon oxide layer; the one or more dielectric layers including at least one semiconductor device adjacent the unfilled channel;
   a passivation layer formed over the one or more dielectric layers; and
   a trench extending through: the passivation layer; the one or more dielectric layers and the silicon layer to the unfilled channel the trench being continuous and contiguous with the unfilled channel wherein the unfilled channel reduces the substrate effects of the at least one semiconductor device.

19. The structure of claim 18, wherein the channel exposes at least a portion of the substrate.

20. The structure of claim 18, wherein the substrate is a silicon substrate.

21. The structure of claim 18, wherein the silicon oxide layer has a thickness of from about 500 to 2000 Å and the silicon layer has a thickness of from about 500 to 2000 Å.

22. The structure of claim 18, wherein the silicon oxide layer has a thickness of from about 500 to 1500 Å and the silicon layer has a thickness of from about 500 to 1500 Å.

23. The structure of claim 18, wherein the passivation layer is comprised of a lower layer and an upper layer.

24. The structure of claim 18, wherein the passivation layer is comprised of a lower PSG layer and an upper nitride or silicon nitride layer.

25. The structure of claim 18, wherein the passivation layer is comprised of:
   a lower PSG layer having a thickness of from about 2000 to 4000 Å; and
   an upper nitride or silicon nitride layer having a thickness of from about 3000 to 8000 Å.

26. The structure of claim 18, wherein the passivation layer is comprised of:
   a lower PSG layer having a thickness of from about 2500 to 3500 Å; and
   an upper nitride or silicon nitride layer having a thickness of from about 4000 to 6000 Å.

27. The structure of claim 18, wherein the channel extends at least partially under the at least one semiconductor device.

28. The structure of claim 18, wherein the at least one semiconductor device is an analog device.

29. The structure of claim 28, further comprising a MOS device on the substrate proximate the analog device, whereby the channel extends at least partially under the MOS device.

30. The structure of claim 18, wherein the one or more dielectric layers are ILD layers.

31. The structure of claim 18, wherein the one or more dielectric layers are comprised of PECVD TEOS oxide, PECVD $SiH_4$ oxide, HDP oxide or a low-k dielectric material.

32. The structure of claim 18, wherein the one or more dielectric layers are comprised of a low-k dielectric material.

33. The structure of claim 18, wherein the channel has a width of from about 50 to 250 μm.

34. The structure of claim 18, wherein the channel has a width of from about 100 to 200 μm.

* * * * *